(12) United States Patent
Matsuse et al.

(10) Patent No.: US 9,035,321 B2
(45) Date of Patent: May 19, 2015

(54) SEMICONDUCTOR DEVICE AND MANUFACTURING METHOD OF SEMICONDUCTOR DEVICE

(75) Inventors: Akihiro Matsuse, Nagoya (JP); Kotaro Yano, Kawasaki (JP)

(73) Assignee: SHOWA DENKO K.K., Tokyo (JP)

( * ) Notice: Subject to any disclaimer, the term of this patent is extended or adjusted under 35 U.S.C. 154(b) by 535 days.

(21) Appl. No.: 13/059,759

(22) PCT Filed: Aug. 20, 2009

(86) PCT No.: PCT/JP2009/003973
§ 371 (c)(1),
(2), (4) Date: Feb. 18, 2011

(87) PCT Pub. No.: WO2010/021136
PCT Pub. Date: Feb. 25, 2010

(65) Prior Publication Data
US 2011/0147767 A1  Jun. 23, 2011

(30) Foreign Application Priority Data
Aug. 21, 2008  (JP) .................................. 2008-212915

(51) Int. Cl.
*H01L 29/24* (2006.01)
*H01L 21/28* (2006.01)
(Continued)

(52) U.S. Cl.
CPC ........ *H01L 21/0485* (2013.01); *H01L 21/0495* (2013.01); *H01L 29/0619* (2013.01);
(Continued)

(58) Field of Classification Search
USPC .................... 257/77, E21.158, E29.104, 473, 257/E29.338; 438/573
See application file for complete search history.

(56) References Cited

U.S. PATENT DOCUMENTS

2002/0125482 A1* 9/2002 Friedrichs et al. .............. 257/73
2004/0016929 A1  1/2004 Nakatsuka et al.
(Continued)

FOREIGN PATENT DOCUMENTS

CN  1938857 A  3/2007
JP  52-024465 A  2/1977
(Continued)

OTHER PUBLICATIONS

Brian J. Johnson et al.; "The effect of titanium on Al—Ti contacts to p-type 4H—SiC"; Solid-State Electronics; vol. 47; No. 9; pp. 1437-1441 (Sep. 2003).
(Continued)

*Primary Examiner* — Lynne Gurley
*Assistant Examiner* — Vernon P Webb
(74) *Attorney, Agent, or Firm* — Sughrue Mion, PLLC

(57) ABSTRACT

There is provided a semiconductor device including an ohmic junction layer which is excellent in surface flatness and uniformity of composition in an interface with a semiconductor substrate and thus can give a sufficiently high adhesiveness with a Schottky junction layer. Such a semiconductor device includes an n type SiC semiconductor substrate (1), a cathode electrode (5) that comes into ohmic contact with a main surface (1b) of one side of the SiC semiconductor substrate (1), a first semiconductor region (6a) that is made of p type SiC formed in a main surface (1a) of the other side of the SiC semiconductor substrate (1), a second semiconductor region (6b) that is made of an n type SiC formed in the main surface (1a) of the other side, an ohmic junction layer (7) that comes into ohmic contact with the first semiconductor region (1a), and a Schottky junction layer (8) that comes into Schottky contact with the second semiconductor region (6b), wherein a root mean square roughness for a surface of the ohmic junction layer (7) is 20 nm or less.

11 Claims, 3 Drawing Sheets

(51) Int. Cl.
  *H01L 21/04* (2006.01)
  *H01L 29/45* (2006.01)
  *H01L 29/47* (2006.01)
  *H01L 29/66* (2006.01)
  *H01L 29/872* (2006.01)
  *H01L 29/06* (2006.01)
  *H01L 29/16* (2006.01)

(52) U.S. Cl.
  CPC ............ *H01L29/1608* (2013.01); *H01L 29/45* (2013.01); *H01L 29/47* (2013.01); *H01L 29/6606* (2013.01); *H01L 29/872* (2013.01)

(56) References Cited

U.S. PATENT DOCUMENTS

| | | | |
|---|---|---|---|
| 2005/0194610 A1 | 9/2005 | Souma et al. | |
| 2006/0151806 A1 | 7/2006 | Fukuda et al. | |
| 2007/0023781 A1 | 2/2007 | Mizukami et al. | |
| 2007/0032040 A1* | 2/2007 | Lederer | 438/455 |
| 2007/0090481 A1* | 4/2007 | Richieri | 257/473 |
| 2008/0277668 A1 | 11/2008 | Okuno et al. | |
| 2010/0135053 A1* | 6/2010 | Morimoto et al. | 363/127 |

FOREIGN PATENT DOCUMENTS

| | | | |
|---|---|---|---|
| JP | 60-086873 A | 5/1985 | |
| JP | 07-066433 A | 3/1995 | |
| JP | 07-086621 A | 3/1995 | |
| JP | 2003-086534 A | 3/2003 | |
| JP | 2003-510817 A | 3/2003 | |
| JP | 2003-258271 A | 9/2003 | |
| JP | 2005-243715 A | 9/2005 | |
| JP | 2007-281231 A | 10/2007 | |
| JP | 2008-282972 A | 11/2008 | |
| JP | 2009-158519 A | 7/2009 | |
| KR | 10-2006-0071415 A | 6/2006 | |
| WO | 01/22498 A1 | 3/2001 | |
| WO | 2008016619 A1 | 2/2008 | |

OTHER PUBLICATIONS

Korean Office Action (Notice of Preliminary Rejection) dated Jul. 11, 2012 for corresponding Korean Patent Application No. 10-2011-7005606.
Chinese Office Action (Notification of the First Office Action) dated May 23, 2012 for corresponding Chinese Patent Application No. 200980131934.6.
Notice of Allowance dated Nov. 20, 2012 for corresponding Korean Patent Application No. 10-2011-7005606.
Osamu Nakatsuka et al.; "CoAl Ohmic Contact Materials with Improved Surface Morphology for p-Type 4H—SiC"; Materials Science Forum; vols. 389-393 (2002); pp. 885-888.
Notification mailed Jun. 14, 2011 for corresponding Japanese Patent Application No. 2008-212915.
Baliga, B. Jayant, "Analysis of a High-Voltage Merged p-i-n/Schottky (MPS) Rectifier," IEEE Electron Device Letters, Sep. 1987, vol. Edl. 8, No. 9.
T. Nakamura et al; "A 4.15 kV 9.07-mΩcm² 4H—SiC Schottky-Barrier Diode Using Mo Contact Annealed at High Temperature"; IEEE Electron Device Letters; vol. 26; No. 2; Feb. 1, 2005; pp. 99-101; XP011125626; ISSN: 0741-3106, DOI: 10.1109/LED.2004.841473; IEEE Service Center, New York, US.
Extended European Search Report dated Nov. 12, 2013 for corresponding European Patent Application No. 09 80 8072.
S.E. Mohney et al, "Morphological study of the Al—Ti ohmic contact to p-type SiC," Solid-State Electronics, vol. 46, Issue 5, May 7, 2002, pp. 689-693.
Japanese Office Action (Notice of Reasons for Rejection) dated May 7, 2013 for corresponding Japanese Patent Application No. 2008-212915.

\* cited by examiner

SEMICONDUCTOR DEVICE AND MANUFACTURING METHOD OF SEMICONDUCTOR DEVICE

BACKGROUND

This application is a National Stage of International Application No. PCT/JP2009/003973 filed on Aug. 20, 2009, claiming priority based on Japanese Patent Application No. 2008-212915, filed on Aug. 21, 2008, the contents of all of which are incorporated herein by reference in their entirety.

TECHNICAL FIELD

The present invention relates to a semiconductor device and a manufacturing method of the semiconductor device, and more particularly to a semiconductor device where an ohmic junction layer has an excellent surface flatness, and a manufacturing method of the semiconductor device.

The present application contains subject matter related to that disclosed in Japanese Priority Patent Application JP 2008-212915 filed in the Japan Patent Office on Aug. 21, 2008, the entire contents of which are hereby incorporated by reference.

BACKGROUND ART

In the related art, in a SiC Schottky bather diode, it is known that when a forward surge current flows, the device is destroyed even by a relatively small surge current. In order to solve this problem, a device structure has been proposed in which an n type region and a p type region are arranged in parallel in one surface of an SiC semiconductor device, and injection of holes which are minority carriers is generated from the p type region when a large current flows (for example, see Non Patent Document 1). In this device structure, surge resistance can be improved.

This device structure is called an MPS (Merged p-i-n Schottky) structure. In the MPS structure, Schottky diodes and pn type diodes are alternately disposed on either surface of a semiconductor device. Therefore, on either surface of the semiconductor device, there is a need to form a junction layer made of a junction material which makes a good Schottky junction with an n type semiconductor region and further comes into good ohmic contact with a p type semiconductor region.

In a case where a junction layer making a Schottky junction with the n type semiconductor region and a junction layer making an ohmic junction with the p type semiconductor region are formed using the same material at the same time, this is preferable in that the manufacturing process can be simplified as compared with a case where they are respectively formed using different materials.

As junction materials which can be used for the junction layer, a NiAl alloy is known (for example, see Patent Document 1). However, in a case where a junction layer made of the NiAl alloy is used, it is difficult to form a uniform junction layer which makes a Schottky junction. This is thought to be for the following reasons.

For example, in a case where a semiconductor substrate made of SiC is used and a junction layer made of a NiAl alloy which makes a Schottky junction is to be formed on a n type semiconductor region of the semiconductor substrate, generally, a layer of metal which will be a NiAl alloy is formed on the n type semiconductor region and then is alloyed at high temperature, thereby forming the junction layer. If the junction layer is formed in this way, there are cases where in an interface between SiC forming the n type semiconductor region and the NiAl alloy forming the junction layer, the composition of Ni and Al included in NiAl is easily non-uniform, and thus a region where a barrier height is non-uniform is generated in the junction layer which makes a Schottky junction. For this reason, if a reverse voltage is applied to the Schottky barrier diode manufactured in this way, there are cases where an increase in leakage current is observed in a region having a low Schottky barrier and sufficient electrical characteristics cannot be obtained.

In order to solve the problem caused by the non-uniformity of the alloy composition in the interface between the alloy making a Schottky junction and the n type semiconductor region, it is preferable to use metal of a single element for the junction layer making a Schottky junction. However, a metal of a single element which makes a good Schottky junction with the n type semiconductor region and makes a good ohmic junction with the p type semiconductor region has not been found until now.

Therefore, for the junction layer which makes a good Schottky junction with the n type semiconductor region and makes a good ohmic junction with the p type semiconductor region, a Schottky junction layer which makes a good Schottky junction with the n type semiconductor region and an ohmic junction layer which makes a good ohmic junction with the p type semiconductor region may be formed using different materials.

For example, an ohmic electrode with respect to a p type SiC semiconductor substrate can be obtained by sequentially depositing Ti and Al and performing heat treatment (for example, see Patent Document 2). Also, Patent Document 2 also discloses an ohmic electrode structure including nickel, silicon, carbon, and aluminum.

[Patent Document 1] PCT Japanese Translation Patent Publication No. 2003-510817

[Patent Document 2] Japanese Unexamined Patent Application Publication No. 2003-86534

[Non Patent Document 1] Analysis of a High-Voltage Merged p-i-n/Schottky (MPS) Rectifier: IEEE Electron Device Letters, Vol. Ed 18; No. 9, September 1987: p407-409

SUMMARY OF INVENTION

Technical Problem

However, in the ohmic junction layer which is obtained by forming the alloy metal layer including Al on the p type semiconductor region and alloying it at high temperature, since the aluminum having a low melting point is melted and aggregated at about 660° C. due to the alloying, there is a problem in that unevenness is generated in the surface and thus the surface becomes rough. In the ohmic junction layer with unevenness in the surface, the composition of the alloy included in the ohmic junction layer is non-uniform in the interface with the semiconductor substrate made of SiC, and thereby deterioration in the electrical characteristics occurs.

Also, in a case where the SiC Schottky diode of the MPS structure is used in a large current, for the ohmic junction layer, there is a need for a low resistance value or stability in the interface with the Schottky junction layer, and further high adhesiveness with the Schottky junction layer formed thereon. However, the ohmic junction layer with the rough surface easily generates gaps between it and the Schottky junction layer formed thereon, and thus sufficiently high adhesiveness with the Schottky junction layer cannot be obtained in some cases.

The present invention is made in consideration of the problems, and an object thereof is to provide a semiconductor device including an ohmic junction layer which has an excellent surface flatness and has a uniform composition in an interface with a semiconductor substrate and thus can achieve sufficiently high adhesiveness with a Schottky junction layer.

Also, an object of the present invention is to provide a manufacturing method of the semiconductor device of the present invention which has an excellent surface flatness.

Solution to Problem

In order to achieve the above-described objects, the present invention employs the following configurations.

(1) A semiconductor device includes an n type SiC semiconductor substrate; a cathode electrode that comes into ohmic contact with a main surface of one side of the SiC semiconductor substrate; a first semiconductor region that is made of p type SiC formed in a main surface of the other side of the SiC semiconductor substrate; a second semiconductor region that is made of an n type SiC formed in the main surface of the other side; an ohmic junction layer that comes into ohmic contact with the first semiconductor region; and a Schottky junction layer that comes into Schottky contact with the second semiconductor region, wherein a root mean square roughness (rms) for a surface of the ohmic junction layer is 20 nm or less.

(2) The semiconductor device set forth in (1), wherein the root mean square roughness for the surface of the ohmic junction layer is 10 nm or less.

(3) The semiconductor device set forth in (1) or (2), wherein the cathode electrode is made of a metal including nickel as a main component.

(4) The semiconductor device set forth in any one of (1) to (3), wherein the Schottky junction layer is made of a metal including molybdenum as a main component.

(5) The semiconductor device set forth in any one of (1) to (4), wherein the ohmic junction layer is made of an alloy including aluminum and titanium.

(6) The semiconductor device set forth in (5), wherein the alloy includes aluminum in a range of from 40 wt % to less than 60 wt % in terms of weight percent.

(7) The semiconductor device set forth in (6), wherein the alloy includes aluminum in a range of from 45 wt % to less than 55 wt % in terms of weight percent.

(8) A manufacturing method of a semiconductor device comprising the steps of forming an n type SiC semiconductor substrate which is provided with a main surface of one side and a main surface of the other side, and which is provided with a first semiconductor region made of p type SiC and a second semiconductor region made of n type SiC in the main surface of the other side; forming a first metal layer on the main surface of one side; forming a cathode electrode which comes into ohmic contact with the main surface of one side by alloying the first metal layer; forming a second metal layer which includes an aluminum layer and a titanium layer on the first semiconductor region and which includes the aluminum layer in a range of from 40 wt % to less than 60 wt % in terms of weight percent; forming an ohmic junction layer which makes an ohmic junction with the first semiconductor region by alloying the second metal layer; forming a third metal layer on the second semiconductor region; and forming a Schottky junction layer which makes a Schottky junction with the second semiconductor region by alloying the third metal layer at a temperature lower than temperature for alloying the second metal layer.

(9) The manufacturing method of the semiconductor device set forth in (8), wherein the step of alloying the first metal layer and the step of alloying the second metal layer are performed together.

(10) The manufacturing method of the semiconductor device set forth in (8) or (9), wherein the second metal layer is alloyed at a temperature of 900° C. or more and 1000° C. below.

(11) The manufacturing method of the semiconductor device set forth in any one of (8) to (10), wherein the second metal layer includes aluminum in a range of from 45 wt % to less than 55 wt % in terms of weight percent.

(12) The manufacturing method of the semiconductor device set forth in any one of (8) to (11), wherein the cathode electrode is made of a metal including nickel as a main component.

(13) The manufacturing method of the semiconductor device set forth in any one of (8) to (12), wherein the Schottky junction layer is made of a metal including molybdenum as a main component.

Advantageous Effects Of Invention

The semiconductor device according to the present invention includes the ohmic junction layer of which the root mean square roughness (rms) is 20 nm or less and which is thus excellent in surface flatness. Therefore, the uniformity of the composition in the interface between the ohmic junction layer and the first semiconductor region is good, a good ohmic junction with the first semiconductor region can be obtained, and a sufficiently high adhesiveness between the ohmic junction layer and the Schottky junction layer can be obtained. Further, the semiconductor device has good electrical characteristics in that reverse leakage current is lowered and forward surge resistance is great.

The manufacturing method of the semiconductor device according to the present invention includes a step of forming the second metal layer which is formed of the aluminum layer and the titanium layer and which includes the aluminum layer of from 40 wt % to less than 60 wt % in terms of weight percent, on the first semiconductor region, a step of forming the ohmic junction layer which makes an ohmic junction with the first semiconductor region by alloying the second metal layer, and a step of forming the third metal layer on the second semiconductor region and alloying it at a temperature lower than the temperature for alloying the second metal layer, thereby forming the Schottky junction layer which makes a Schottky junction with the second semiconductor region by alloying the third metal layer. Therefore, it is possible to prevent aluminum from being aggregated due to the melting of aluminum included in the second metal by the alloying. For this reason, according to the manufacturing method of the semiconductor device of the present invention, the semiconductor device is realized which has an ohmic junction layer making a good ohmic junction with the first semiconductor region, excellent in surface flatness with a root mean square roughness of 20 nm or less, and giving a sufficiently high adhesiveness with the Schottky junction layer.

DESCRIPTION OF EMBODIMENTS

Figure 1:
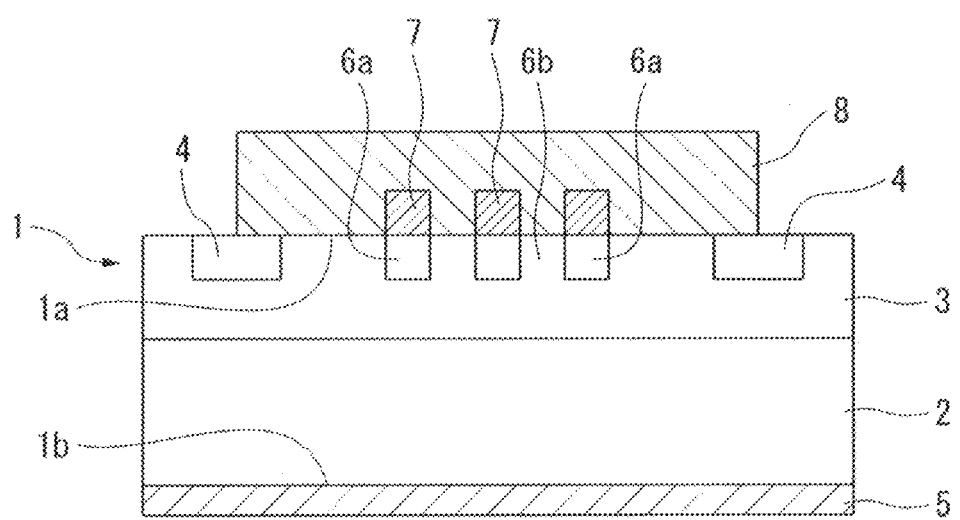
FIG. 1 is a longitudinally sectional view illustrating a Schottky barrier diode which is an example of a semiconductor device of the present invention.

Hereinafter, the present invention will be described with reference to the accompanying drawings. In addition, the size, the thickness, or the dimension of each part shown in the drawings referenced in the following description may be different from the relationship of the dimensions of an actual semiconductor device.

Semiconductor Device

FIG. 1 is a longitudinally sectional view illustrating a Schottky barrier diode which is an example of a semiconductor device of the present invention. The Schottky bather diode shown in FIG. 1 includes a SiC semiconductor substrate 1, a cathode electrode 5, an ohmic junction layer 7, and a Schottky junction layer 8.

The SiC semiconductor substrate 1 shown in FIG. 1 is of n type, and includes an $n^+$ type SiC layer 2 and an $n^-$ type SiC layer 3. The $n^+$ type SiC layer 2 is formed of an $n^+$ type 4H—SiC monocrystalline substrate. The impurity concentration of the $n^+$ type SiC layer 2 is preferably about $2\times10^{18}$ $cm^{-3}$. Also, the thickness of the $n^+$ type SiC layer 2 is preferably about 350 μm.

The $n^-$ type SiC layer 3 is formed of an $n^-$ type epitaxial layer which is formed on the $n^+$ type SiC layer 2. The impurity concentration of the $n^-$ type SiC layer 3 is preferably about $1\times10^{16}$ $cm^{-3}$. The thickness of the $n^-$ type SiC layer 3 is preferably about 8 μm.

In an upper surface 1a which is a surface (a main surface of the other side) of the $n^-$ type SiC layer 3 side of the SiC semiconductor substrate 1, there are provided a plurality of first semiconductor regions 6a made of p type SiC, guard rings 4 made of p type SiC, and second semiconductor regions 6b which are disposed between the first semiconductor regions 6a, and between the first semiconductor regions 6a and the guard rings 4 and which are formed of the surface of the $n^-$ type SiC layer 3.

The first semiconductor regions 6a are made of $p^+$ type SiC which is formed by ion implantation of aluminum. As shown in FIG. 1, the first semiconductor regions 6a may be provided in plurality in the surface (the upper surface 1a) of the $n^-$ type SiC layer 3 side, and may be provided alone. The planar shape of the first semiconductor regions 6a is not particularly limited but may have, for example, a linear shape, an island shape, a network-like shape.

The guard rings 4 are disposed in a ring shape so as to surround the first semiconductor regions 6a on the surface (a main surface of the other side) of the $n^-$ type SiC layer 3 side of the SiC semiconductor substrate 1, and are formed to extend over the edge portions of the Schottky junction layer 8 when seen from the top. The guard rings 4 alleviate electric field concentration in the edges of the Schottky junction layer 8. The guard rings 4 are made of $p^+$ type SiC which is formed by ion implantation of aluminum in the same manner as the first semiconductor regions 6a.

In the guard rings 4 and the first semiconductor regions 6a, the concentration of aluminum ions or the thickness where aluminum ions forming $p^+$ type SiC are implanted may be the same or different. Specifically, for example, the amount of aluminum ions to be implanted forming $p^+$ type SiC of the first semiconductor regions 6a and the guard rings 4 may be about $1\times10^{15}$ $cm^{-2}$, and the thickness where aluminum ions are implanted may be about 300 nm.

The ohmic junction layers 7 are electrodes which come into ohmic contact with $p^+$ type SiC forming the first semiconductor regions 6a. The ohmic junction layers 7 may come into ohmic contact with a portion of the first semiconductor regions 6a or all of the first semiconductor regions 6a.

The thickness of each ohmic junction layer 7 is preferably in a range from 100 nm to 200 nm, and more preferably about 160 nm.

The root mean square roughness of the ohmic junction layers 7 is 20 nm or less, and more preferably 10 nm or less.

Also, the ohmic junction layer 7 is made of alloy including aluminum and titanium, includes aluminum in a range of from 40 wt % to less than 60 wt % in terms of weight percent, and more preferably includes aluminum in a range of from 45 wt % to less than 55 wt % in terms of weight percent. If aluminum is less than 40 wt % in terms of weight percent, there is a concern that the resistance value in the ohmic junction layer 7 is not sufficiently lowered. Also, if aluminum exceeds 60 wt % in terms of weight percent, there is a concern that the root mean square roughness is not sufficiently lowered since the surface flatness of the ohmic junction layer 7 is deteriorated.

The alloy including aluminum and titanium may include only aluminum and titanium, and may include aluminum of from 40 wt % to less than 60 wt % in terms of weight percent, and, in addition to titanium, elements such as Ni, Si, or C.

The Schottky junction layer 8 is an electrode which comes into Schottky contact with the $n^-$ type SiC layer 3 forming the second semiconductor region 6b. The Schottky junction layer 8 is electrically connected to the ohmic junction layers 7. The Schottky junction layer 8 is provided to cover the entire inside of the guard rings 4, and the edge portions thereof overlap with the guard rings 4 when seen from the top.

The Schottky junction layer 8 is made of a metal including molybdenum as a main component. Examples of the metal including molybdenum as a main component include not only a simple substance of molybdenum, but also a metal including Ni, Ti, W, Ta, Pt, and the like.

The cathode electrode 5 is provided in a lower surface 1b which is a surface (a main surface of one side) of the $n^+$ type SiC layer 2 side of the SiC semiconductor substrate 1. The cathode electrode 5 comes into ohmic contact with the $n^+$ type SiC layer 2.

The cathode electrode 5 is made of a metal including nickel as a main component. Examples of the metal including nickel as a main component include not only a simple substance of nickel, but also a metal including Ti, Al, and the like.

The thickness of the cathode electrode 5 is not particularly limited, but is preferably about 100 nm.

Manufacturing Method of Semiconductor Device

Figure 2A:
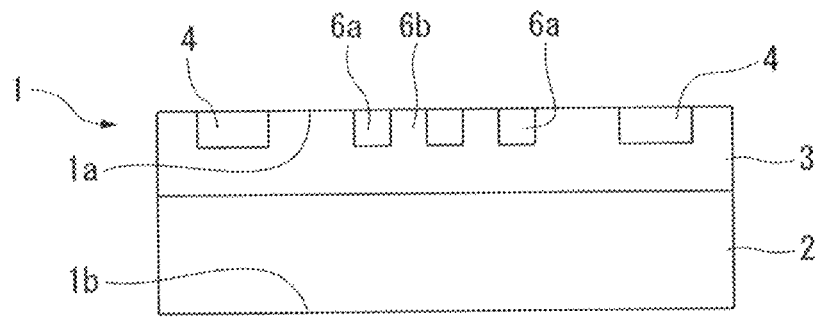
FIG. 2A is a process diagram illustrating a manufacturing method of the Schottky barrier diode shown in FIG. 1.
Figure 2B:
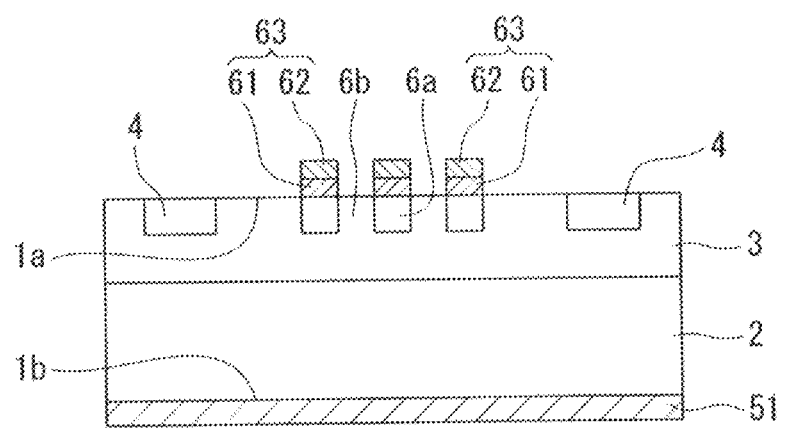
FIG. 2B is a process diagram illustrating a manufacturing method of the Schottky barrier diode shown in FIG. 1.
Figure 2C:
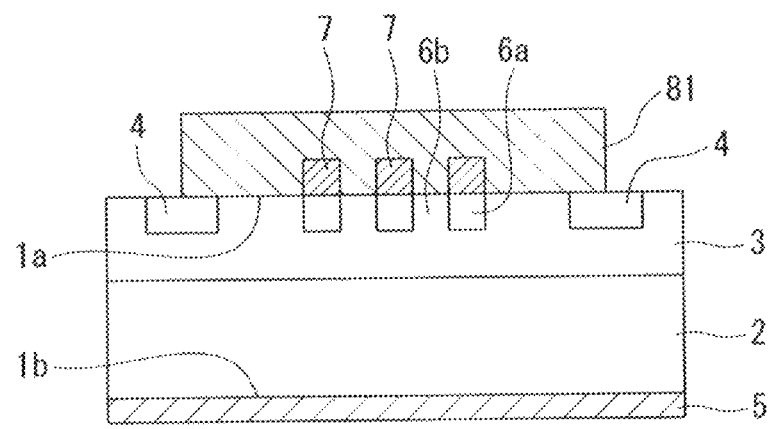
FIG. 2C is a process diagram illustrating a manufacturing method of the Schottky barrier diode shown in FIG. 1.

As an example of a manufacturing method of the semiconductor device of the present invention, a manufacturing method of the Schottky barrier diode shown in FIG. 1 will be described with reference to FIGS. 2A to 2C. FIGS. 2A to 2C are process diagrams illustrating a manufacturing method of the Schottky barrier diode shown in FIG. 1.

In order to manufacture the Schottky barrier diode shown in FIG. 1, first, there is a preparation of the n type SiC semiconductor substrate 1 which is provided with the $n^+$ type SiC layer 2 and the n⁻ type SiC layer 3 by forming the n⁻ type SiC layer 3 on the n⁺ type SiC layer 2 using an n⁻ type epitaxial layer.

A SiO$_2$ layer with the thickness of, for example, about 2 μm is formed on the n⁻ type SiC layer 3 using a plasma CVD device, and then is patterned to have a shape corresponding to the guard rings 4 and the first semiconductor regions 6a by a photolithography process. Next, a portion of the SiO$_2$ layer is removed to expose regions where the guard rings 4 and the first semiconductor regions 6a will be formed on the n⁻ type SiC layer 3, and then aluminum ions are implanted into the regions to form p⁺ type SiC. In this way, as shown in FIG. 2A, the first semiconductor regions 6a, the guard rings 4, and the second semiconductor regions 6b are formed in the upper surface 1a of the SiC semiconductor substrate 1. Thereafter, the SiO$_2$ layer is removed, and the SiC semiconductor substrate 1 is introduced into a high temperature heating furnace and then undergoes heat treatment, for example, at a temperature of 1800° C. for three minutes, thereby activating the aluminum ions which have been implanted into the guard rings 4 and the first semiconductor regions 6a.

Next, as shown in FIG. 2B, a first metal layer 51 made of a metal including nickel as a main component is formed in the surface (the lower surface 1b) of the n⁺ type SiC layer 2 of the SiC semiconductor substrate 1 using an electron beam (EB) deposition method, or the like.

Next, titanium layers 61 and aluminum layers 62 are sequentially formed to have a laminated structure on the first semiconductor regions 6a of the n⁻ type SiC layer 3 over the entire region of the first semiconductor regions 6a by using the shape corresponding to the ohmic junction layers 7 which have been patterned in the photolithography process, by the electron beam (EB) deposition method or the like. Thereby, a second metal layer 63 shown in FIG. 2B which includes the aluminum layers 62 of from 40 wt % to less than 60 wt % in terms of weight percent is formed. The weight percent of the aluminum layer 62 included in the second metal layer 63 can be adjusted by setting the thickness of each layer forming the second metal layer 63.

The laminated order of the titanium layer 61 and the aluminum layer 62 in the laminated structure forming the second metal layer 61 is not particularly limited, and the titanium layer 61 may be formed first, or the aluminum layer 62 may be formed first.

Thereafter, the SiC semiconductor substrate 1 provided with the first metal layer 51 and the second metal layer 63 is introduced into the high temperature heating furnace and undergoes heat treatment at a temperature of 900° C. or more and 1000° C. below for one minute to five minutes at atmospheric pressure under an atmosphere of argon gas, thereby alloying (heat treatment for alloying) the first metal layer 51 and the second metal layer 63 at the same time. In this way, as shown in FIG. 2C, the cathode electrode 5 coming into ohmic contact with the n⁺ type SiC layer 2 and the ohmic junction layers 7 making an ohmic junction with the first semiconductor regions 6a are formed.

If the temperature for alloying the second metal layer 63 which forms the ohmic junction layers 7 is less than 900° C., there is a concern that the resistance value in the ohmic junction layers 7 is not sufficiently lowered. If the temperature for alloying the second metal layer 63 is 1000° C. or more, there is a concern that the surface flatness of the ohmic junction layers 7 deteriorates and thus the root mean square roughness is not sufficiently lowered.

Next, as shown in FIG. 2C, a third metal layer 81, which is made of a metal including molybdenum as a main component, covers the entire inside of the guard rings 4, and overlaps with the guard rings 4 in edge portions when seen from the top, is formed on the second semiconductor regions 6b of the n⁻ type SiC layer 3 by using the shape corresponding to the Schottky junction layer 8 which has been patterned in the photolithography process, by the electron beam (EB) deposition method or the like.

Next, the SiC semiconductor substrate 1 provided with the third metal layer 81 is introduced into the high temperature heating furnace, and undergoes heat treatment at a temperature lower than the temperature for alloying the first metal layer 51 and the second metal layer 63 for five minutes to 20 minutes, thereby alloying the third metal layer 81. In this way, the Schottky junction layer 8 making a Schottky junction with the second semiconductor regions 6b is formed and the Schottky barrier diode shown in FIG. 1 can be obtained.

The Schottky barrier diode in this embodiment includes the ohmic junction layer 7 of which the root mean square roughness is 20 nm or less and which is thus excellent in surface flatness. Therefore, the uniformity of the composition in the interface between the ohmic junction layer 7 and the first semiconductor region 6a is good, a good ohmic junction with the first semiconductor region 6a can be obtained, and a sufficiently high adhesiveness between the ohmic junction layer 7 and the Schottky junction layer 8 can be obtained. Further, the Schottky barrier diode has good electrical characteristics in that reverse leakage current is lowered and forward surge resistance is great.

Also, in the Schottky barrier diode in this embodiment, in a case where the root mean square roughness of the ohmic junction layer 7 is 10 nm or less, the uniformity of the composition in the interface between the ohmic junction layers 7 and the first semiconductor regions 6a becomes better, and the adhesiveness between the ohmic junction layers 7 and the Schottky junction layer 8 is further heightened.

In the Schottky barrier diode in this embodiment, the ohmic junction layer 7 is made of the alloy including aluminum and titanium, and thus the resistance value in the ohmic junction layer 7 is sufficiently low and thus a good ohmic junction with the first semiconductor regions 6a is obtained.

Moreover, in the Schottky barrier diode in this embodiment, the Schottky junction layer 8 is made of the metal including molybdenum as a main component, and thus the Schottky junction layer 8 coming into good Schottky contact with the n⁻ type SiC layer 3 which forms the second semiconductor regions 6b is provided.

Further, in this embodiment, since the ohmic junction layer 7 is made of the alloy including aluminum and titanium, and the Schottky junction layer 8 is made of the metal including molybdenum as a main component, the electrical connection between the ohmic junction layers 7 and the Schottky junction layer 8 is also good.

In the Schottky barrier diode in this embodiment, since the ohmic junction layer 7 is made of the alloy including aluminum and titanium, and the cathode electrode 5 is made of the metal including nickel as a main component, the alloying of the first metal layer 51 forming the cathode electrode 5 and the alloying of the second metal layer 63 forming the ohmic junction layers 7 are performed together, and thereby the cathode electrode 5 and the ohmic junction layers 7 can be formed. Therefore, it is possible to simplify the manufacturing process as compared with a case where the first metal layer 51 and the second metal layer 63 are separately alloyed.

The manufacturing method of the Schottky barrier diode in this embodiment includes a step of forming the second metal layer 63 which is formed of the aluminum layer 61 and the titanium layer 62 and which includes the aluminum layer 61 of 40 wt % or more and less than 60 wt % in terms of weight percent, on the first semiconductor region 6a, a step of forming the ohmic junction layer 7 by alloying the second metal layer 63, and a step of forming the third metal layer 81 on the second semiconductor region 6b and alloying it at a temperature lower than the temperature for alloying the second metal layer 63, thereby forming the Schottky junction layer 8. Therefore, as described below, it is possible to prevent aluminum from being aggregated due to the melting of aluminum included in the second metal layer 63 by the alloying and to prevent the unevenness of the surface caused by the aggregation of aluminum.

In other words, in this embodiment, the second metal layer 63 forming the ohmic junction layer 7 is formed of the aluminum layer 61 and the titanium layer 62 and includes the aluminum layer 62 of 40 wt % or more and less than 60 wt % in terms of weight percent, and the amount of aluminum is reduced so as to sufficiently decrease the resistance value in the ohmic junction layer 7. Therefore, the amount of aluminum which is melted by the alloying is small and thus the melted aluminum is prevented from being aggregated.

In this embodiment, since the Schottky junction layer 8 is formed by alloying the third metal layer 81 at the temperature lower than the temperature for alloying the second metal layer 63, aluminum included in the ohmic junction layer 7 is prevented from being melted and aggregated by the alloying of the third metal layer 81.

As such, in the manufacturing method of the Schottky barrier diode in this embodiment, the aggregation of aluminum included in the second metal layer 63 is prevented, it is possible to manufacture the Schottky barrier diode having the ohmic junction layer 7 which makes a good ohmic junction with the first semiconductor regions 6a, has an excellent surface flatness in the root mean square roughness of 20 nm or less, and thus can give a sufficiently high adhesiveness with the Schottky junction layer 8.

Further, in the manufacturing method of the Schottky bather diode in this embodiment, since the second metal layer 63 is alloyed at a temperature of 900° C. or more and 1000° C. below, it is possible to obtain the ohmic junction layer 7 having a sufficiently low resistance value and further an excellent surface flatness.

In the manufacturing method of the Schottky barrier diode in this embodiment, in a case where the second metal layer 63 includes aluminum in a range of 45 wt % or more and 55 wt % or below in terms of weight percent, it is possible to obtain the ohmic junction layer 7 having a better surface flatness.

In the manufacturing method of the Schottky barrier diode in this embodiment, since the Schottky junction layer 8 is made of the metal including molybdenum as a main component, the Schottky junction layer 8 can be formed by alloying the third metal layer 81 at the temperature lower than the temperature for alloying the second metal layer 63.

The present invention is not limited to the above-described embodiment. For example, the method of forming the first metal layer 51, the second metal layer 63, and the third metal layer 81 is not limited to the electron beam (EB) deposition method, but may use a sputtering method, a resistance heating method, or the like.

In order to simplify the manufacturing process, as shown in the above-described embodiment, the first semiconductor regions 6a and the guard rings 4 are formed together, but the first semiconductor regions 6a and the guard rings 4 may be formed separately.

A crystalline polymorph of the SiC monocrystalline substrate forming the n$^+$ type SiC layer 2 is not limited to 4H—SiC but may be 6H—SiC or 3H—SiC.

The alloying of the first metal layer 51 and the second metal layer 63 is performed at atmospheric pressure under an atmosphere of argon, but may be performed under an atmosphere of nitrogen or in a vacuum. Further, the alloying of the first metal layer 51 and the second metal layer 63 may be performed under an atmosphere of argon by a rapid thermal annealing (RTA) method.

EXAMPLE

Hereinafter, the present invention will be described in detail based on an Example. However, the present invention is not limited only to the Example.

Example

The Schottky barrier diode shown in FIG. 1 was manufactured as follows.

First, there was a preparation of the n type SiC semiconductor substrate 1 which was provided with the n$^+$ type SiC layer 2, which is formed of an n$^+$ type 4H—SiC monocrystalline substrate and has an impurity concentration of $2\times10^{18}$ cm$^{-3}$, and the n$^-$ type SiC layer 3 having an impurity concentration of $1\times10^{16}$ cm$^{-3}$, by forming the n$^-$ type SiC layer 3 having the thickness of 8 μm on the n$^+$ type SiC layer 2 having a thickness of 350 μm using an n$^-$ type epitaxial layer.

Next, a SiO$_2$ layer with the thickness of 2 μm was formed on the n$^-$ type SiC layer 3 using a plasma CVD device, and then was patterned by a photolithography process. Next, a portion of the SiO$_2$ layer was removed to expose regions where the guard rings 4 and the first semiconductor regions 6a will be formed on the n$^-$ type SiC layer 3, and then aluminum ions were implanted into the regions with the amount of ions to be implanted of $1\times10^{15}$cm$^{-2}$, and ion-implanted thickness of 300 nm, to thereby form p$^+$ type SiC. In this way, a plurality of first semiconductor regions 6a, the guard rings 4, and a plurality of second semiconductor regions 6b were formed on the upper surface 1a of the n$^-$ type SiC layer 3 of the SiC semiconductor substrate 1. Thereafter, the SiO$_2$ layer was removed, and the SiC semiconductor substrate 1 was introduced into a high temperature heating furnace and then underwent heat treatment at a temperature of 1800° C. for three minutes, thereby activating the aluminum ions which had been implanted into the guard rings 4 and the first semiconductor regions 6a.

Next, the first metal layer 51 made of nickel was formed in the surface (the lower surface 1b) of the n$^+$ type SiC layer 2 of the SiC semiconductor substrate 1 using the electron beam (EB) deposition method.

Next, titanium layers having the thickness of 60 nm and the aluminum layers having the thickness of 100 nm were sequentially formed to have a laminated structure on the first semiconductor regions 6a of the n$^-$ type SiC layer 3 over the entire region of the first semiconductor regions 6a by using the shape corresponding to the ohmic junction layers 7 which had been patterned in the photolithography process, by the electron beam (EB) deposition method. Thereby, the second metal layer 63 in which the weight percent of the aluminum layers 62 and the titanium layer 61 is Ti:Al=51:49 was formed.

Thereafter, the SiC semiconductor substrate 1 provided with the first metal layer 51 and the second metal layer 63 was introduced into the high temperature heating furnace and underwent heat treatment at a temperature of 900° C. for five minutes at atmospheric pressure under an atmosphere of argon gas, thereby alloying the first metal layer 51 and the second metal layer 63 at the same time. In this way, the cathode electrode 5 having the thickness of 100 nm and the ohmic junction layers 7 having the thickness of 160 nm were formed.

Next, the third metal layer 81, which is made of molybdenum, covers the entire inside of the guard rings 4, and overlaps with the guard rings 4 in edge portions when seen from the top, was formed on the second semiconductor regions 6b of the n⁻ type SiC layer 3 by using the shape corresponding to the Schottky junction layer 8 which had been patterned in the photolithography process, by the electron beam (EB) deposition method.

Next, the SiC semiconductor substrate 1 provided with the third metal layer 81 was introduced into the high temperature heating furnace, and underwent heat treatment at a temperature of 600° C. for ten minutes, thereby alloying the third metal layer 81. In this way, the Schottky junction layer 8 was formed, and thus the Schottky barrier diode in the Example was manufactured.

Comparative Example

A Schottky bather diode in the comparative example was manufactured by the same method as in the Example except that a titanium layer having the thickness of 20 nm and an aluminum layer having the thickness of 100 nm were sequentially formed to have a laminated structure (the weight percent of the titanium layer and the aluminum layer, Ti:Al=26:74) as the second metal layer, and thus an ohmic junction layer having the thickness of 120 nm was formed.

In order to examine the surface flatness of the ohmic junction layers forming the Schottky barrier diodes in the Example and the comparative example obtained in this way, the surfaces of the ohmic junction layers were observed from the Schottky junction layer using an electron microscope before the Schottky junction layers were formed. The results are shown in FIGS. 3A and 3B.

Figure 3A:
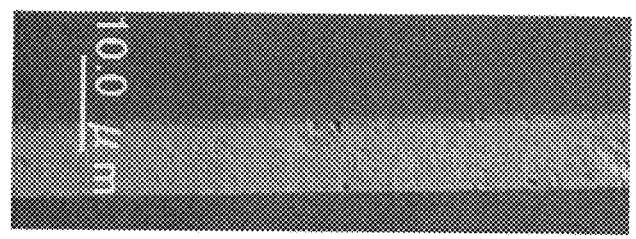
FIG. 3A is a diagram illustrating an electron microscope picture of an ohmic junction layer of the Schottky barrier diode, and shows an Example.
Figure 3B:
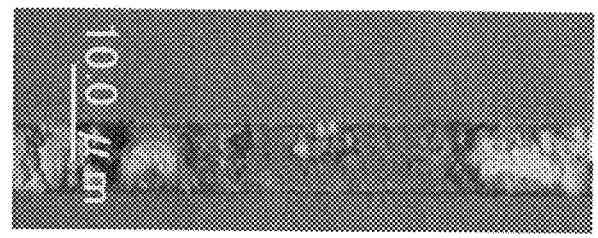
FIG. 3B is a diagram illustrating an electron microscope picture of an ohmic junction layer of the Schottky barrier diode, and shows a comparative example.

FIGS. 3A and 3B are diagrams illustrating electron microscope pictures of the ohmic junction layers of the Schottky bather diodes, and FIG. 3A shows the Example, and FIG. 3B shows the comparative example. As shown in FIGS. 3A and 3B, it can be seen that the surface is flat in the Example, but unevenness is great and the surface is rough in the comparative example.

The root mean square roughness (rms) for the surfaces of the ohmic junction layers was measured before the Schottky junction layer was formed, using an atomic force microscope (AFM).

As a result, the root mean square roughness was 9 nm in the Example, and 29 nm in the comparative example, which exceeded 20 nm.

The electrical characteristics of the Schottky barrier diodes in the Example and the comparative example obtained in this way were examined.

As a result, a current density was 2500 A/cm² in the comparative example and 4000 A/cm² in this Example, and from this, it was confirmed that the Example has a greater forward surge resistance than the comparative example.

Industrial Applicability

The present invention is applicable to a semiconductor device, and a manufacturing method of the semiconductor device, and particularly to a semiconductor device having an ohmic junction layer excellent in surface flatness and a manufacturing method of the semiconductor device.

REFERENCE SIGNS LIST

1 SiC semiconductor substrate
1a upper surface (main surface of the other side)
1b lower surface (main surface of one side)
2 n⁺ type SiC layer
3 n⁻ type SiC layer
4 guard ring
5 cathode electrode
6a first semiconductor region
6b second semiconductor region
7 ohmic junction layer
8 Schottky junction layer
51 first metal layer
61 titanium layer
62 aluminum layer
63 second metal layer
81 third metal layer

The invention claimed is:

1. A semiconductor device comprising:
an n type SiC semiconductor substrate having a main surface on one side of the substrate and a main surface on a side opposing the one side of the substrate;
a cathode electrode that comes into ohmic contact with the main surface of the one side of the SiC semiconductor substrate;
a first semiconductor region that is made of p type SiC formed in the main surface of the opposing side of the SiC semiconductor substrate;
a second semiconductor region that is made of an n type SiC formed in the main surface of the opposing side;
an ohmic junction layer that comes into ohmic contact with the first semiconductor region; and
a Schottky junction layer that comes into Schottky contact with the second semiconductor region,
wherein a root mean square roughness for a surface of the ohmic junction layer is 20 nm or less,
the ohmic junction layer is made of an alloy including aluminum and titanium, and
the alloy includes aluminum in a range of from 40 wt % to less than 60 wt % in terms of weight percent.

2. The semiconductor device according to claim 1, wherein the root mean square roughness for the surface of the ohmic junction layer is 10 nm or less.

3. The semiconductor device according to claim 1, wherein the cathode electrode is made of a metal including nickel as a main component.

4. The semiconductor device according to claim 1, wherein the Schottky junction layer is made of a metal including molybdenum as a main component.

5. The semiconductor device according to claim 1, wherein the alloy includes aluminum in a range of from 45 wt % to less than 55 wt % in terms of weight percent.

6. A manufacturing method of the semiconductor device, said semiconductor device comprising:
an n type SiC semiconductor substrate having a main surface on one side of the substrate and a main surface on a side opposing the one side of the substrate;
a cathode electrode that comes into ohmic contact with the main surface of the one side of the SiC semiconductor substrate;
a first semiconductor region that is made of p type SiC formed in the main surface of the opposing side of the SiC semiconductor substrate;
a second semiconductor region that is made of an n type SiC formed in the main surface of the opposing side;

an ohmic junction layer that comes into ohmic contact with the first semiconductor region; and a Schottky junction layer that comes into Schottky contact with the second semiconductor region, wherein a root mean square roughness for a surface of the ohmic junction layer is 20 nm or less, the ohmic junction layer is made of an alloy including aluminum and titanium, and the alloy includes aluminum in a range of from 40 wt% to less than 60 wt% in terms of weight percent, said manufacturing method comprising the steps of:

forming the n type SiC semiconductor substrate having a main surface on the one side of the substrate and a main surface on the side opposing the one side of the substrate, and which is provided with the first semiconductor region made of p type SiC in the main surface of the opposing side and the second semiconductor region made of n type SiC in the main surface of the opposing side;

forming a first metal layer on the main surface of the one side;

forming the cathode electrode that comes into ohmic contact with the main surface of the one side by alloying the first metal layer;

forming a second metal layer which includes an aluminum layer and a titanium layer on the first semiconductor region and which includes the aluminum layer in a range of from 40 wt% to less than 60 wt% in terms of weight percent;

forming the ohmic junction layer which makes an ohmic junction with the first semiconductor region by alloying the second metal layer;

forming a third metal layer on the second semiconductor region; and forming the Schottky junction layer which makes a Schottky junction with the second semiconductor region by alloying the third metal layer at a temperature lower than a temperature for alloying the second metal layer.

7. The manufacturing method of the semiconductor device according to claim 6, wherein the step of alloying the first metal layer and the step of alloying the second metal layer are performed together.

8. The manufacturing method of the semiconductor device according to claim 6, wherein the second metal layer is alloyed at a temperature of from 900° C. to less than 1000° C.

9. The manufacturing method of the semiconductor device according to claim 6, wherein the second metal layer includes aluminum in a range of from 45 wt% to less than 55 wt% or below in terms of weight percent.

10. The manufacturing method of the semiconductor device according to claim 6, wherein the cathode electrode is made of a metal including nickel as a main component.

11. The manufacturing method of the semiconductor device according to claim 6, wherein the Schottky junction layer is made of a metal including molybdenum as a main component.

* * * * *